(12) United States Patent
Baars et al.

(10) Patent No.: US 9,608,110 B2
(45) Date of Patent: Mar. 28, 2017

(54) METHODS OF FORMING A SEMICONDUCTOR CIRCUIT ELEMENT AND SEMICONDUCTOR CIRCUIT ELEMENT

(71) Applicant: GLOBALFOUNDRIES Inc., Grand Cayman (KY)

(72) Inventors: Peter Baars, Dresden (DE); Carsten Grass, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/812,245

(22) Filed: Jul. 29, 2015

(65) Prior Publication Data
US 2016/0111549 A1    Apr. 21, 2016

(30) Foreign Application Priority Data
Oct. 21, 2014 (DE) .......... 10 2014 221 371

(51) Int. Cl.
| | |
|---|---|
| *H01L 21/00* | (2006.01) |
| *H01L 21/28* | (2006.01) |
| *H01L 21/8234* | (2006.01) |
| *H01L 29/78* | (2006.01) |
| *H01L 27/088* | (2006.01) |
| *H01L 29/66* | (2006.01) |
| *H01L 29/51* | (2006.01) |
| *H01L 21/8238* | (2006.01) |

(Continued)

(52) U.S. Cl.
CPC .. *H01L 29/78391* (2014.09); *H01L 21/28185* (2013.01); *H01L 21/28291* (2013.01); *H01L 21/823462* (2013.01); *H01L 21/823857* (2013.01); *H01L 27/088* (2013.01); *H01L 27/092* (2013.01); *H01L 27/11592* (2013.01); *H01L 29/513* (2013.01); *H01L 29/516* (2013.01); *H01L 29/517* (2013.01); *H01L 29/66545* (2013.01)

(58) Field of Classification Search
CPC ..... H01L 21/28; H01L 21/8234; H01L 21/00; H01L 21/28291; H01L 21/823462; H01L 21/31691; H01L 21/31604; H01L 29/51; H01L 29/66; H01L 29/78; H01L 29/423; H01L 29/78391; H01L 29/42364; H01L 29/66545; H01L 29/516
USPC ............................................. 438/3, 239, 240
See application file for complete search history.

(56) References Cited

U.S. PATENT DOCUMENTS

| | | | |
|---|---|---|---|
| 2002/0047170 A1* | 4/2002 | Ota | ................... H01L 21/28194 257/410 |
| 2009/0134493 A1* | 5/2009 | Iwaki | ...................... H01L 28/55 257/532 |
| 2014/0183642 A1* | 7/2014 | Liang | .............. H01L 21/823412 257/368 |

\* cited by examiner

*Primary Examiner* — Chuong A Luu
(74) *Attorney, Agent, or Firm* — Amerson Law Firm, PLLC

(57) ABSTRACT

The present disclosure provides methods of forming a semiconductor circuit element and a semiconductor circuit element, wherein the semiconductor circuit element includes a first semiconductor device with a first gate structure disposed over a first active region of a semiconductor substrate and a second semiconductor device with a second gate structure disposed over a second active region of the semiconductor substrate, the first gate structure comprising a ferroelectric material buried into the first active region before a gate electrode material is formed on the ferroelectric material and the second gate structure comprising a high-k material different from the ferroelectric material.

19 Claims, 7 Drawing Sheets

(51) Int. Cl.
*H01L 27/092* (2006.01)
*H01L 27/11592* (2017.01)

METHODS OF FORMING A SEMICONDUCTOR CIRCUIT ELEMENT AND SEMICONDUCTOR CIRCUIT ELEMENT

BACKGROUND OF THE INVENTION

1. Field of the Invention

The present disclosure generally relates to methods of forming a semiconductor circuit element and to a semiconductor circuit element, and, more particularly, to forming a semiconductor circuit element having two semiconductor devices, one of which comprises a ferroelectric high-k material and the other comprising a high-k material different from the ferroelectric high-k material.

2. Description of the Related Art

In modern electronic equipment, integrated circuits (ICs) experience a vast applicability in a continuously spreading range of applications. Particularly, the demand for increasing mobility of electronic devices at high performance and low energy consumption drives developments to more and more compact devices having features with sizes ranging even into the deep sub-micron regime; the more so as current semiconductor technologies are apt of producing structures with dimensions in the magnitude of 10 nm. With ICs representing a set of electronic circuit elements integrated on a semiconductor material, normally silicon, ICs can be made much smaller than discreet circuits composed of independent circuit components. The majority of present-day ICs are implemented by using a plurality of circuit elements, such as field effect transistors (FETs), also called metal oxide semiconductor field effect transistors (MOSFETs or simply MOS transistors), and passive elements, such as resistors and capacitors, integrated on a semiconductor substrate with a given surface area. Typically, present-day integrated circuits involve millions of single circuit elements formed on a semiconductor substrate.

The basic function of a FET or a MOSFET is that of an electronic switching element, wherein a current through a channel region between two contact regions, referred to as source and drain, is controlled by a gate electrode, which is disposed over the channel region and to which a voltage relative to source and drain is applied. Particularly, in applying a voltage exceeding a characteristic voltage level to the gate electrode, the conductivity state of a MOSFET is changed and the characteristic voltage level, usually called "threshold voltage" and in the following referred to as Vt, characterizes the switching behavior of a MOSFET. In general, Vt depends nontrivially on the transistor's properties, e.g., materials, dimensions, etc., such that the implementation of a desired Vt involves plural steps of adjustment and fine-tuning during the fabrication process.

Currently, the most common digital integrated circuits built today use CMOS logic, which is fast and offers a high circuit density and low power per gate. CMOS devices or "complementary symmetry metal oxide semiconductor" devices, as sometimes referred to, make use of complementary and symmetrical pairs of P-type and N-type MOSFETs for implementing logic functions. Two important characteristics of CMOS devices are the high noise immunity and low static power consumption of a CMOS device because the series combination of complementary MOSFETs in a CMOS device draws significant power only momentarily during switching between on- and off-states, since one transistor of a CMOS device is always in the off-state. Consequently, CMOS devices do not produce as much waste heat as other forms of logic, for example, transistor-transistor logic (TTL) or NMOS logic, which normally have some standing current even when not changing state. In current CMOS technologies, standard transistors and IO devices have the same high-k dielectric and metal electrode, whereas, in comparison with standard devices, the $SiO_2$ oxide of IO devices is thicker.

In efforts to improve memory arrays, ferroelectric gate field effect transistors (FeFETs) have been recently in the focus of research. In general, ferroelectric materials have dielectric crystals which show a spontaneous electric polarization similar to ferromagnetic materials showing a spontaneous magnetization. Upon applying an appropriate external electric field to a ferroelectric material, the direction of polarization can be reoriented. The basic idea is to use the direction of spontaneous polarization in ferroelectric memories for storing digital bits. In FeFETs, the effect that one makes use of is the possibility to adjust the polarization state of a ferroelectric material on the basis of appropriate electrical fields which are applied to the ferroelectric material which, in a FeFET, is usually the gate oxide. Since the polarization state of a ferroelectric material is preserved unless it is exposed to a high, with regard to the polarization state, counter-oriented electrical field or a high temperature, it is possible to "program" a capacitor formed of ferroelectric material such that an induced polarization state reflects an information unit. Therefore, an induced polarization state is preserved, even upon removing an accordingly "programmed" device from a power supply. In this way, FeFETs allow the implementation of non-volatile electrically-switchable data storage devices.

On the basis of ferroelectric materials, it is possible to provide non-volatile memory devices, particularly random-access memory devices similar in construction to DRAM devices, but differing in using a ferroelectric layer instead of a dielectric layer such that non-volatility is achieved. For example, the 1T-1C storage cell design in a FeRAM is similar in construction to the storage cell in widely used DRAM in that both cell types include one capacitor and one access transistor—a linear dielectric is used in a DRAM cell capacitor, whereas, in a FeRAM cell capacitor, the dielectric structure includes a ferroelectric material. Other types of FeRAMs are realized as 1T storage cells which consist of a single FeFET employing a ferroelectric dielectric instead of the gate dielectric of common MOSFETs. The current-voltage characteristic between source and drain of a FeFET depends in general on the electric polarization of the ferroelectric dielectric, i.e., the FeFET is in the on- or off-state, depending on the orientation of the electric polarization state of the ferroelectric dielectric. Writing of a FeFET is achieved in applying a writing voltage to the gate relative to source, while a 1T-FeRAM is read out by measuring the current upon applying a voltage to source and drain. It is noted that reading out of a 1T-FeRAM is non-destructive.

Though a FeFET or a ferroelectric capacitor represent in theory very promising concepts for complex semiconductor devices, it is a difficult task to identify appropriate ferroelectric materials which are compatible with existing advanced manufacturing processes of complex devices, particularly at very small scales. For example, commonly-known ferroelectric materials, such as PZT or perovskites, are not compatible with standard CMOS processes. According to present understanding, hafnium (Hf) materials which are used in current fabrication technologies exhibit a paraelectric behavior due to the predominantly monoclinic crystal structure present in $HfO_2$. However, recent research results indicate that dielectric materials on the basis of hafnium oxide may represent promising candidates for materials with ferroelectric behavior to be used in the fabrication of ferroelectric semiconductor devices of ICs. For example, it was shown that the monoclinic structure may be suppressed in Zr, Si, Y and Al-doped hafnium oxide materials and stabilized crystal structures of ferroelectric nature were obtained in experiments with accordingly-doped samples.

In conventional HK/MG (high-k/metal gate) FEOL (front end of line) process flows, the thick high-k material of FeFET devices is formed in parallel to the high-k gate oxide of logic devices. Herein, a stack is formed in conventional integration approaches over high-k materials in the gate structure of FeFET devices, the stack comprising ferroelectric high-k material and the logic high-k material. Although this stack of ferroelectric high-k material and logic high-k material shows ferroelectric properties, the speed and function of the FeFET devices is negatively affected by parasitic capacitances appearing in the stack. This problem is present in FeFET integration, independent of whether a gate last or replacement gate technique or a gate first technique is employed.

Gate last or replacement gate techniques suffer the problem that the critical dimension of gate structures of FeFET devices is limited by the thick high-k layer of FeFET devices. The reason is that, with gate trenches being filled after gate patterning in replacement gate techniques, the additional ferroelectric layer structures to be formed in the gate trenches reduce the space in the gate trench which is left to the replacement gate materials. For example, in comparing gate structures of gate last and gate first techniques, the initial critical dimension of gate structures in gate last or replacement gate techniques has to be increased by at least 20 nm in comparison to gate first approaches in order to accommodate for the work function adjusting material layer(s) and the gate electrode material.

Furthermore, in gate last or replacement gate approaches close to the 28 nm technology node employing early nickel silicide, an activation anneal for ferroelectric high-k material is limited to temperatures at 450° C. or less. Alternative approaches using replacement gate schemes with late nickel silicidation considerably increase the complexity of conventional gate last or replacement gate process flows.

In view of the above-described situation, it is, therefore, desirable to integrate a full functional FeFET device into existing process flows in gate first and gate last approaches without increasing the complexity of existing process flows and addressing, at least partially, the aforementioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides methods of forming a semiconductor circuit element and a semiconductor circuit element, wherein the semiconductor circuit element includes a first semiconductor device with a first gate structure disposed over a first active region of a semiconductor substrate and a second semiconductor device with a second gate structure disposed over a second active region of the semiconductor substrate, the first gate structure comprising a ferroelectric material buried into the first active region before a gate electrode material is formed on the ferroelectric material and the second gate structure comprising a high-k material different from the ferroelectric material.

In a first aspect of the present disclosure, a method of forming a semiconductor circuit element having a first semiconductor device and a second semiconductor device is provided. In some illustrative embodiments herein, the method includes providing the first semiconductor device in and on a first active region of a semiconductor substrate, the first semiconductor device including a first gate structure with a first gate dielectric layer, and providing the second semiconductor device in and on a second active region of the semiconductor substrate adjacent to the first active region, the second semiconductor device including a second gate structure with a second gate dielectric layer, wherein the first gate dielectric layer is formed by providing a buried ferroelectric material in the first active region, and wherein the second gate dielectric layer is formed by forming a high-k material over the second active region, the high-k material being different from the ferroelectric material.

In a second aspect of the present disclosure, a method of forming a semiconductor circuit element is provided. In some illustrative embodiments herein, the method includes forming a recess in a first active region of a semiconductor substrate, providing a ferroelectric material in the recess, forming a high-k material over a second active region of the semiconductor substrate adjacent to the first active region, the high-k material being different from the ferroelectric material, forming a gate electrode material over the first and second active regions, forming a first gate structure over the first active region by patterning the ferroelectric material and the gate electrode material, and forming a second gate structure over the second active region by patterning the high-k material and the gate electrode material.

In a third aspect of the present disclosure, a method of forming a semiconductor circuit element is provided. In some illustrative embodiments herein, the method includes forming a recess in a first active region of a semiconductor substrate, forming an amorphous film of material in the recess, the amorphous film of material exhibiting ferroelectric behavior in a crystalline phase, covering the amorphous film of material by a first cap layer, forming a high-k material over a second active region of the semiconductor substrate adjacent to the first active region after the cap layer is formed over the amorphous film of material, the high-k material being different from the amorphous film of material, crystallizing the amorphous film of material for forming a ferroelectric material buried in the first active region, forming a first gate dielectric layer over the first active region by patterning the ferroelectric material, and forming a second gate dielectric layer over the second active region by patterning the high-k material.

In a fourth aspect of the present disclosure, a semiconductor circuit element is provided. In some illustrative embodiments herein, the semiconductor circuit element includes a first semiconductor device formed over and in a first active region of a semiconductor substrate, the first semiconductor device including first source/drain regions in the first gate structure with a first gate dielectric layer, and a second semiconductor device formed over and in a second active region of the semiconductor substrate adjacent to the first active region, the second semiconductor device including second source/drain regions and a second gate structure with a second gate dielectric layer, wherein the first gate dielectric layer comprises a ferroelectric material and the second gate dielectric layer comprises a high-k material different from the ferroelectric material, and wherein an upper surface of the first active region below the first gate structure is lowered in the semiconductor substrate relative to an upper surface of the second active region.

BRIEF DESCRIPTION OF THE DRAWINGS

The disclosure may be understood by reference to the following description taken in conjunction with the accompanying drawings, in which like reference numerals identify like elements, and in which.

Figure 1A:
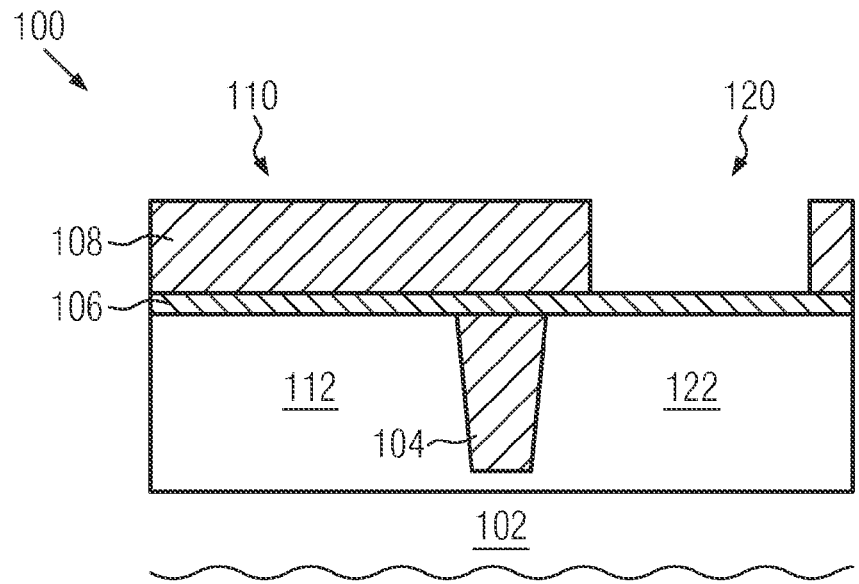
FIGS. 1a-1e show a process flow in accordance with some illustrative embodiments of the present disclosure, wherein a buried amorphous high-k material is provided.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices may be fabricated by using advanced technologies. Semiconductor circuit elements of the present disclosure may be fabricated by technologies applied to approach technology nodes smaller than 100 nm, for example, smaller than 50 nm or smaller than 35 nm, i.e., ground rules smaller or equal to 45 nm are imposed. After a complete reading of the present application, a person skilled in the art will appreciate that the present disclosure suggests semiconductor circuit elements that may have structures with minimal length and/or width dimensions smaller than 100 nm, for example, smaller than 50 nm or smaller than 35 nm. For example, the present disclosure may provide for semiconductor devices fabricated by using 45 nm technologies or below, e.g., 28 nm or below.

After a complete reading of the present application, a person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

In some aspects of the present disclosure, a semiconductor circuit element having a first semiconductor device and a second semiconductor device may be formed. In accordance with some illustrative embodiments herein, the first semiconductor device may comprise a first gate structure disposed on a first active region which is provided in a semiconductor substrate, the first gate structure comprising a first gate dielectric layer provided by a ferroelectric material buried into the first active region. The second semiconductor device may comprise a second gate structure disposed on a second active region of the semiconductor substrate adjacent to the first active region, the second gate structure comprising a second gate dielectric layer formed by a high-k material different from the ferroelectric material. After a complete reading of the present application, a person skilled in the art will appreciate that, in approaches employing gate last techniques, the first and second gate structures may further comprise a dummy gate electrode structure which is, after the formation of the first and second gate dielectric layers, replaced by first and second gate electrode structures. The first and second gate electrode structures may comprise a layer of a work function-adjusting material and a gate electrode material, such as polysilicon, amorphous silicon or aluminum.

In some illustrative embodiments, the ferroelectric material may be provided by forming an amorphous film of material buried into the first active region, wherein the amorphous film of material is substantially different from the high-k material formed over the second active region, and wherein the amorphous film of material exhibits ferroelectric behavior in a crystalline phase. Subsequently to forming the buried amorphous film of material, a process for crystallizing the amorphous film of material is performed such that the buried ferroelectric material is obtained. In accordance with illustrative examples herein, the amorphous film of material is encapsulated by a cap layer prior to crystallizing the amorphous film of material. In accordance with some illustrative examples, the amorphous film of material may be crystallized upon forming the cap layer over the first active region, e.g., when the cap layer is deposited at a temperature greater than or equal to the crystallization temperature of the amorphous film of material. In accordance with some other illustrative examples, the amorphous film of material may be crystallized by performing an annealing process for crystallizing the amorphous film of material. Herein, the cap layer is formed prior to the crystallization, wherein the cap layer is formed at temperatures less than the crystallization temperature of the amorphous film of material.

In some illustrative embodiments, the cap layer may be formed on the amorphous film of material prior to forming the high-k material over the second active region. For example, the cap layer may be formed after appropriately masking the semiconductor substrate such that the second active region is covered by a mask or hardmask, while the first active region is at least partially exposed to further processing. After having formed the cap layer, the masking pattern may be removed such that the second active region is exposed to further processing.

In some illustrative embodiments, the high-k material may be formed on the cap layer when forming the high-k material over the second active region. For example, the high-k material may be blanket-deposited over the first and second active regions.

In some illustrative embodiments, the high-k material may be removed from above the cap layer in using the cap layer as an etch stop. For example, over the first active region, the high-k material may be selectively etched relative to the material of the cap layer to remove the high-k material from above the first active region.

In accordance with some illustrative embodiments of the present disclosure, the cap layer may comprise TiN. In some special examples herein, the cap layer may be formed by a layer of TiN.

In some illustrative embodiments of the present disclosure, particularly upon employing a gate last or replacement gate approach, a dummy gate electrode may be formed over the buried ferroelectric material after the high-k material is formed on the second active region. Herein, the dummy gate electrode may be subsequently replaced by a work function-adjusting material and a gate electrode material. In some illustrative embodiments herein, the buried ferroelectric material may be formed by forming a buried amorphous film of material in the first active region and by forming a cap layer on the buried amorphous film of material prior to forming the high-k material over the second active region, wherein the amorphous film of material exhibits ferroelectric behavior in a crystalline phase. Herein, the cap layer is provided before the dummy gate electrode is formed such that the cap layer may be used as an etch stop when replacing the dummy gate electrode over the first active region. Accordingly, a hybrid gate last or replacement gate approach may be employed, wherein the ferroelectric material is reliably encapsulated by the cap layer during formation and replacement of the dummy gate electrode.

In accordance with some illustrative embodiments of the present disclosure, the ferroelectric material in the first active region may be buried by forming a recess in the first active region and forming an amorphous film of material in the recess, the amorphous film of material exhibiting ferroelectric behavior in a crystalline phase. For example, the amorphous film of material may be deposited by an atomic layer deposition (ALD) process or a chemical vapor deposition (CVD) process or a physical vapor deposition (PVD) process at a deposition temperature smaller than the crystallization temperature of the amorphous film of material. Subsequently, a cap layer may be formed on the amorphous film of material in the recess for encapsulating the amorphous film of material. Accordingly, the amorphous film of material may be reliably encapsulated during subsequent processing. Alternatively, the amorphous film of material may be crystallized when depositing the cap layer. Otherwise, a subsequent crystallization process may be performed after the amorphous film of material is encapsulated by the cap layer. In accordance with some illustrative embodiments herein, the high-k material may be formed over the second active region after the cap layer is formed on the amorphous film of material and prior to the crystallization process. In accordance with some illustrative embodiments herein, the second gate dielectric layer may be formed prior to the formation of the first gate dielectric layer, wherein the first and second gate dielectric layers are formed by sequentially patterning the high-k material and the buried ferroelectric material.

In other aspects of the present disclosure, a semiconductor circuit element is formed. In accordance with some illustrative embodiments herein, a recess may be formed in a first active region of a semiconductor substrate and an amorphous film of material may be formed in the recess, wherein the amorphous film of material exhibits ferroelectric behavior in a crystalline phase. The amorphous film of material may be covered by a cap layer. Over a second active region of the semiconductor substrate adjacent to the first active region, a high-k material that is different from the amorphous film of material may be formed after the cap layer is formed over the amorphous film of material. Subsequently, the amorphous film of material may be crystallized for forming a ferroelectric material buried into the first active region. Then, a first gate dielectric layer may be formed over the first active region by patterning the ferroelectric material and a second gate dielectric layer may be formed over the second active region by patterning the high-k material.

In accordance with some illustrative embodiments, forming the first and second gate dielectric layers may be comprised of forming a first gate structure comprising the first gate dielectric layer over the first active region and forming a second gate structure comprising the second gate dielectric layer over the second active region. Herein, a gate electrode material may be formed over the ferroelectric material and the high-k material prior to the formation of the gate dielectric layers. For example, a first gate structure may be formed over the first active region by patterning the ferroelectric material and the gate electrode material over the first active region and a second gate structure may be formed over the second active region by patterning the high-k material and the gate electrode material over the second active region. Depending on whether a gate first or a gate last approach is chosen, the gate electrode material formed on at least one of the ferroelectric material and the high-k material may be either a dummy gate electrode material which is to be subsequently replaced by a work function adjusting material and a final gate electrode material, or may remain in the gate structure.

In some illustrative embodiments, the second gate structure may be formed before the formation of the first gate structure is completed.

In some illustrative embodiments, a further cap layer may be formed over the high-k material prior to the crystallization.

In further aspects of the present disclosure, a semiconductor circuit element may be provided. In accordance with some illustrative embodiments herein, the semiconductor circuit element may comprise a first semiconductor device formed over and in a first active region of a semiconductor substrate and a second semiconductor device formed over and in a second active region of the semiconductor substrate adjacent to the first active region. The first semiconductor device may comprise first source/drain regions and a first gate structure with a first gate dielectric layer, while the second semiconductor device may comprise second source/drain regions and a second gate structure with a second gate dielectric layer. Herein, the first gate dielectric layer may comprise a ferroelectric material and a second gate dielectric layer may comprise a high-k material different from the ferroelectric material. Furthermore, an upper surface of the first active region below the first gate structure may be lowered in the semiconductor substrate relative to an upper surface of the second active region.

In some illustrative embodiments, the first and second gate structures may extend along a normal direction of the upper surface of one of the first active region and the second active region up to a mutual height level. For example, the first and second gate structures may have an upper surface at an equal height level above the first active region or the second active region.

In some illustrative embodiments, a thickness of the first gate electrode layer may be greater than a thickness of the second gate dielectric layer.

In some illustrative embodiments of the various aspects of the present disclosure, the ferroelectric material may be a ferroelectric high-k material and the amorphous film of material may comprise an amorphous high-k material. In accordance with some illustrative examples, the ferroelectric material may comprise one of ZrO and a hafnium-based material. In some special illustrative example, the ferroelectric high-k material may be ZrO. In accordance with some other illustrative examples, the ferroelectric material may be one of pure $HfO_2$ and $HfSiO_2$ and $HfZrO_2$ and $HfYO_2$.

In the following, semiconductor circuit elements and methods of forming semiconductor circuit elements in accordance with various exemplary embodiments of the present disclosure will be described with regard to the attached figures. The described process steps, procedures and materials are to be considered as only exemplary and to illustrate to one of ordinary skill in the art illustrative methods for practicing the subject matter disclosed herein. However, it is to be understood that the invention is not exclusively limited to the illustrated and described exemplary embodiments, as many possible modifications and changes may exist which will become clear to the person skilled in the art when studying the present detailed description together with the accompanying drawings and the above background and summary of the invention. Illustrated portions of semiconductor devices may include only a limited number of elements, although those skilled in the art will recognize that actual implementations of semiconductor devices may include a large number of such elements. Various steps in the manufacture of semiconductor devices are well known and so, in the interests of brevity, many conventional steps will only be mentioned briefly or will be omitted entirely without providing the well-known process details.

FIG. 1a schematically shows in a cross-sectional view a semiconductor circuit element 100 in accordance with some illustrative embodiments of the present disclosure. The semiconductor circuit element 100 is provided on a semiconductor substrate 102. The semiconductor substrate may be, for example, a bulk substrate or represent an active layer of a silicon-on-insulator (SOI) substrate or silicon/germanium-on-insulator (SGOI) substrate. In general, the terms "substrate," "semiconductor substrate" or "semiconducting substrate" should be understood to cover all semiconductor materials and all forms of such semiconductor materials and no limitation to a special kind of substrate is intended.

Within the semiconductor substrate 102, two active regions 112, 122 separated by an isolation structure, such as a shallow trench isolation (STI) 104, are formed in the semiconductor substrate. Optionally, at least one of the active regions 112, 122 may be doped. For example, the active regions 112, 122 may be similarly doped or counter-doped or one of the active regions 112, 122 may be one of P-type doped and N-type doped. After a complete reading of the present application, a person skilled in the art will appreciate, in accordance with some explicit examples herein, a doping of active regions with dopants may be achieved by performing an appropriate implantation process for implanting the dopants.

As illustrated in FIG. 1a, the active regions 112, 122 may be separated by a single STI 104. However, this does not pose any limitation to the present disclosure and the person skilled in the art will appreciate that, alternatively at least one or more active regions may be formed in between the active regions 112 and 122.

After a complete reading of the present application, a person skilled in the art will appreciate that the active region 112 is comprised of a semiconductor device 110, while the active region 122 is comprised of a semiconductor device 120. In accordance with the illustration in FIG. 1a, a masking pattern may be formed over the semiconductor substrate such that the active region 112 is covered, while the active region 122 is at least partially exposed. In the illustrated example, the active region 122 is partially exposed. The masking pattern may be provided by a hard mask, as illustrated in FIG. 1a, e.g., by a nitride layer 106 and a lithographically patterned photoresist 108.

Figure 1B:
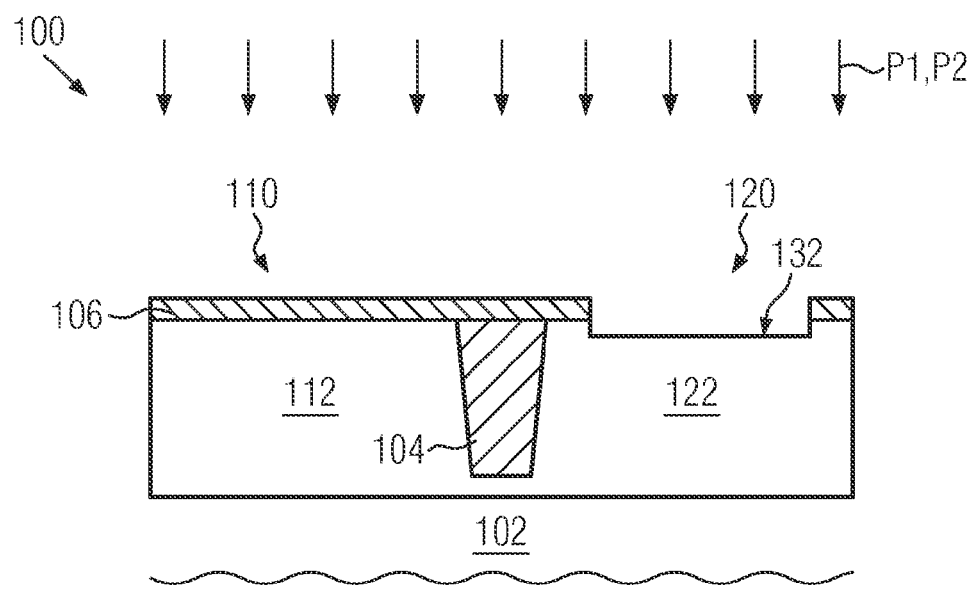

FIG. 1b schematically illustrates the semiconductor circuit element 100 at a subsequent stage during fabrication, wherein processes P1 and P2 are performed. Particularly, the illustrated stage corresponds to a stage in the process flow at which the process P1 is completed and before the process P2 is performed. As a result of process P1, a recess 132 is formed in the nitride layer 106 and in the active region 122 in accordance with the patterned photoresist 108 (FIG. 1a). Subsequently, the patterned photoresist 108 may be removed in a cleaning process (not illustrated). After the process P1 is performed and the photoresist 108 is removed in a subsequent cleaning process (not illustrated), the process P2 is performed.

Figure 1C:
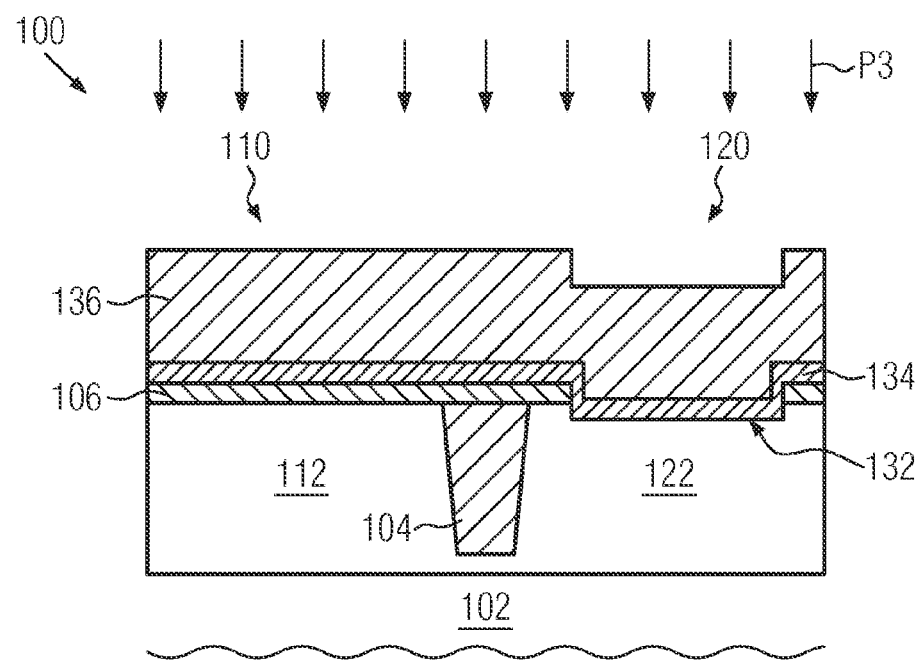

FIG. 1c schematically illustrates the semiconductor circuit element 100 at a stage during fabrication, when the process P2 has been completed, prior to a process P3 being performed. In process P2, an amorphous high-k material 134 was formed in the recess 132, at least partially filling the recess 132 with the amorphous high-k material 134. As is illustrated in FIG. 1c, the amorphous high-k material is deposited on the nitride layer 106 outside the recess 132 and on inner sidewalls of the recess 132 and on the bottom of the recess 132 such that any portion of the active region 122 being exposed in the recess 132 is covered by the amorphous high-k material 134.

Subsequent to the formation of the high-k material 134, an insulating material 136 different from the nitride material 106 is formed over the semiconductor circuit element 100 and particularly over the semiconductor device 110 and the semiconductor device 120. In accordance with some illustrative embodiments herein, the insulating material layer 136 is formed directly on the amorphous high-k material 134, as illustrated in FIG. 1c. For example, the insulating material of the insulating material layer 136 may be an oxide material, such as silicon oxide deposited by TEOS deposition or silane pyrolysis.

Subsequent to the formation of the amorphous high-k material 134 and the insulating material layer 136, a process P3 is performed for substantially exposing the active region 112 and the active region 122 with a buried amorphous high-k material 124 (FIG. 1d) which is a portion of the high-k material 134. The high-k material 134 is buried into the active region 122 as illustrated in FIG. 1d.

In some illustrative examples, the process P3 may be a CMP (chemical mechanical polishing) process using the nitride layer 106 for end-point detection. Optionally, an additional strip process may be performed for removing the nitride layer 106. Although the layer 106 is described above as a nitride layer, the person skilled in the art will appreciate that this does not pose any limitation on the present disclosure. In accordance with other illustrative embodiments of the present disclosure, the layer 106 may be provided by an oxide material, e.g., silicon oxide, whereas the material of the insulating material layer 136 may be a nitride material, e.g., silicon nitride.

Figure 1D:
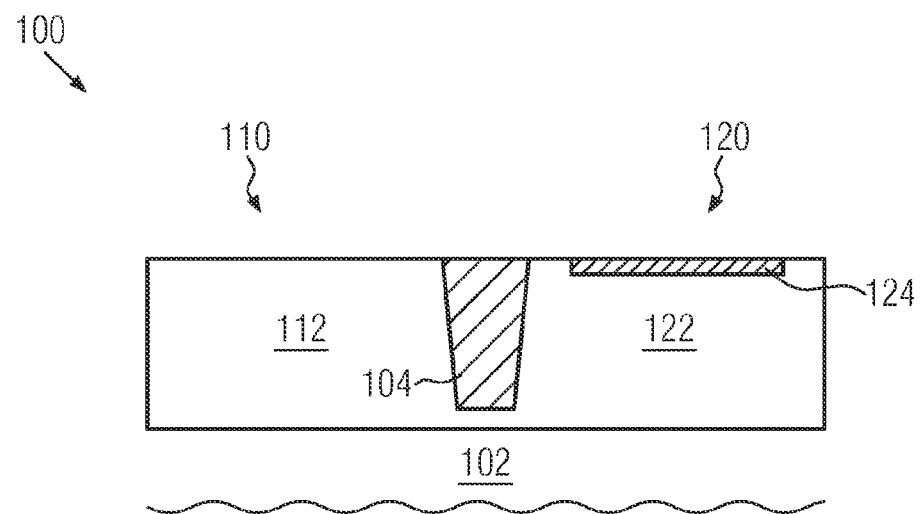

FIG. 1d schematically shows the semiconductor circuit element 100 after the process P3 is completed. The active region 112 of the semiconductor device 110 is exposed to further processing. In the semiconductor device 120, the buried amorphous high-k material 124 and part of the material of the active region 122 is exposed. Due to the CMP process P3, the upper surfaces of the active region 112, and active region 122 and the buried amorphous high-k material 124 are level.

Figure 1E:
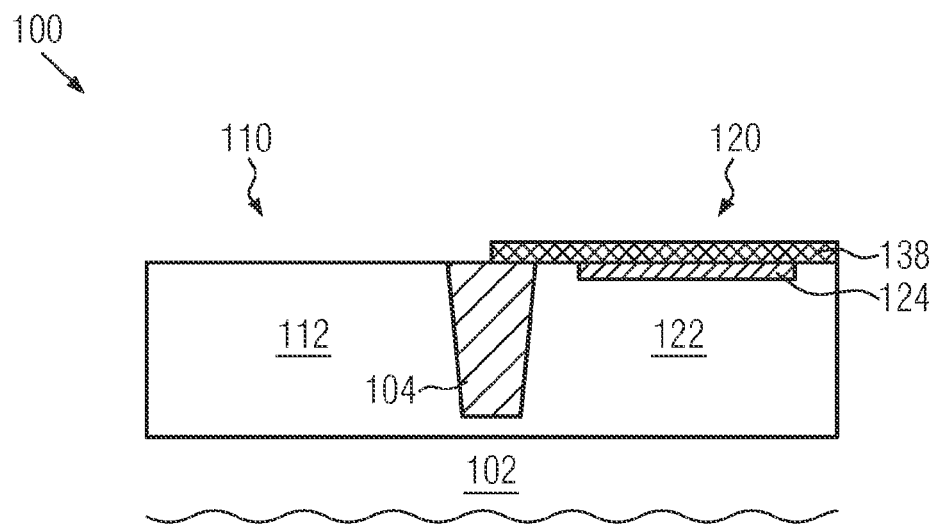

Subsequently, a cap layer 138 is formed over the active region 122 and the buried amorphous high-k material 124, as shown in FIG. 1e. Particularly, the buried amorphous high-k material 124 may be encapsulated by the cap layer 138 such that the buried amorphous high-k material 124 is buried into the active region 122 and encapsulated by the cap layer 138 in the active region 122.

In some illustrative examples herein, the cap layer 138 may comprise TiN. For example, the cap layer 138 may be formed by depositing TiN material over the semiconductor circuit element 100, masking the semiconductor circuit element 100 such that the semiconductor device 110 is exposed, while the semiconductor device 120 is covered by a mask (not illustrated). In a subsequent RIE (reactive ion etch) or a wet etch, the cap material is removed from above the active region 112 such that the cap layer 138 remains over the active region 122. Alternatively, the active region 112 may be covered by a photolithographically patterned mask such that the active region 122 is exposed to a deposition process for forming the cap layer 138 over the active region 122.

After a complete reading of the present application, a person skilled in the art will appreciate that, in accordance with some illustrative embodiments of the present disclosure, an annealing process (not illustrated) may be performed for crystallizing the buried amorphous high-k material 124 such that, at least partially, the buried amorphous high-k material 124 may crystallize in a stable ferroelectric crystal configuration, e.g., in the orthorhombic phase. In accordance with some alternative embodiments of the present disclosure, the crystallization of the buried amorphous high-k material 124 may take place upon forming the cap layer 138 on the amorphous high-k material 124 as described above. After a complete reading of the present application, a person skilled in the art will appreciate that at the stage during fabrication illustrated in FIG. 1e, the buried high-k material 124 may be either amorphous or in the ferroelectric phase. As the buried high-k material 124 may be either ferroelectric or amorphous, it will be referred to in the following as "the buried high-k material 124." The buried high-k material 124 is to be understood as being either ferroelectric or amorphous, unless explicitly stated.

Figure 2A:
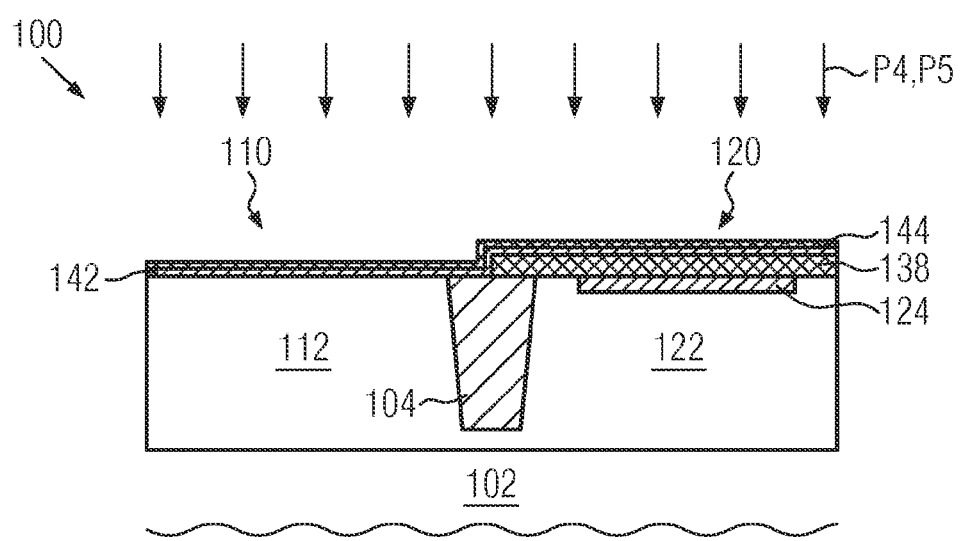
FIGS. 2a-2d show, in accordance with some illustrative embodiments of the present disclosure, a process flow in which a high-k material is formed in the presence of the buried amorphous high-k material and a ferroelectric high-k material is formed.

With regard to FIGS. 2a-2d, a process sequence for forming a high-k material different from the buried high-k material 124 over the active region 112 is schematically illustrated. FIG. 2a schematically shows the semiconductor circuit element 100 at a stage during fabrication, in which a process P4 is completed, prior to the application of a process P5. In the process P4, a high-k material 142 is formed above the active region 112 and a cap layer 144 is formed on the high-k material layer 142 over the active region 112. The high-k material 142 may be different from the high-k material 124. For example, in case that the high-k material 124 is ferroelectric at the illustrated stage during fabrication, the high-k material 142 may differ from the high-k material 134 at least in that the high-k material 142 is in a stable paraelectric configuration or in that the thickness of the high-k material 142 is smaller than the thickness of the buried high-k material 124. In some illustrative, but not limiting, examples herein, the thickness of the high-k material 142 may be within a range from about 40 Angstrom (or 4 nm) to about 150 Angstrom (or 15 nm) thick, such as, for example, about 80 Angstrom (or 8 nm). Additionally or alternatively, the thickness of the buried high-k material 124 may be within a range from about 20 Angstrom (or 2 nm) to about 40 Angstrom (or 4 nm), such as, for example, about 20 Angstrom (or 2 nm). In case the high-k material 124 is amorphous at the illustrated stage during fabrication, the high-k material 142 may differ from the buried high-k material 124 in that the high-k material 142 is at least crystalline, preferably in a stable nonferroelectric configuration. In some examples herein, the high-k material 142 and the buried high-k material 124 may be substantially different chemical materials. In some illustrative embodiments, as it is shown in FIG. 2a, the high-k material 142 and the cap layer 144 may be deposited on the active region 112 and over the active region 122, particularly, on the cap layer 138.

Figure 2B:
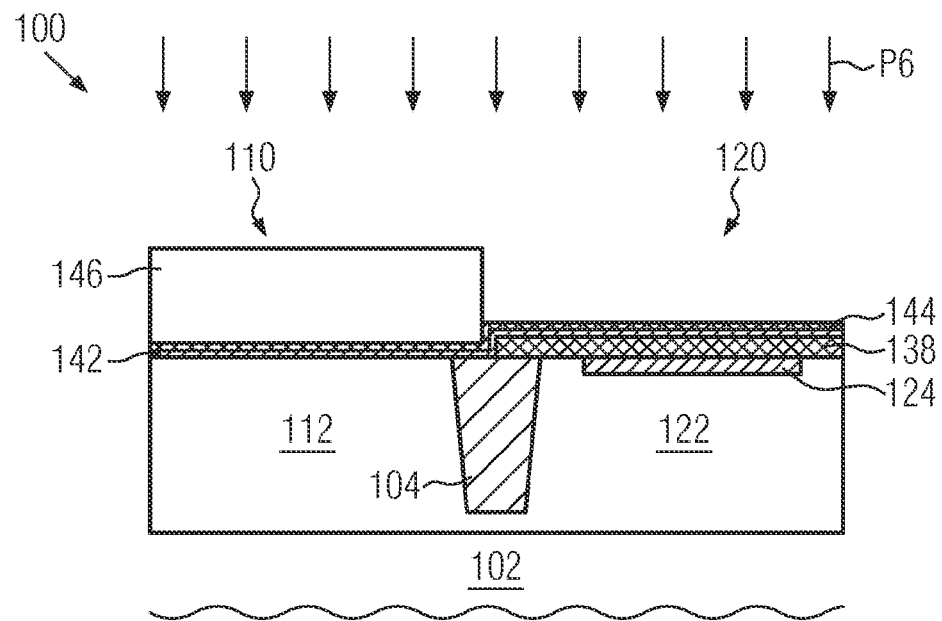
Figure 2C:
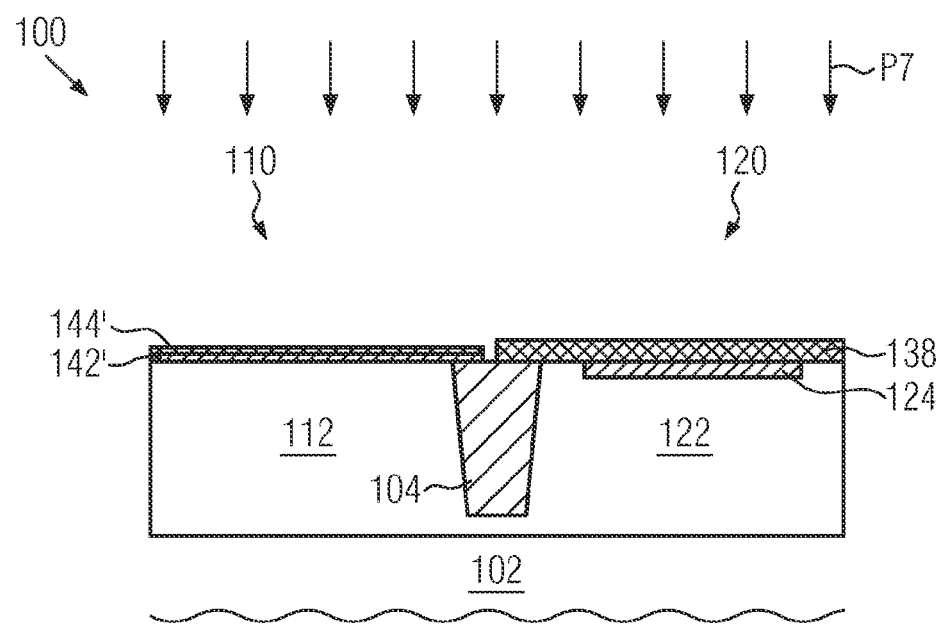

Subsequent to the process P4, the process P5 is performed for forming a masking pattern over the active regions 112, 122. FIG. 2b schematically illustrates the semiconductor circuit element 100 after the process P5 is completed. The masking pattern 146 may comprise, for example, a photolithographically patterned photoresist 146. The patterned photoresist 146 covers the cap layer 144 over the active region 112, while the cap layer 144 over the active region 122 remains exposed to further processing. Subsequently, a process P6 may be applied to the semiconductor circuit element 100, to which the semiconductor device 120 and particularly the cap layer 144 is exposed. In some illustrative embodiments of the present disclosure, the process P6 may comprise an RIE process for removing the cap layer 144 and the high-k material 142 from above the active region 122. Herein, the cap layer 138 may be used as an etch stop for the process P6. After a strip of the photolithographically patterned photoresist 146, a process P7 may be performed as illustrated in FIG. 2c.

In accordance with some illustrative embodiments, the process P7 may comprise front end of line annealing steps for activating the ferroelectric nature of the ferroelectric high-k material, healing crystal damages due to possible implantation process (not illustrated) and/or activating dopants implanted during possible implantation sequences (not illustrated).

Figure 2D:
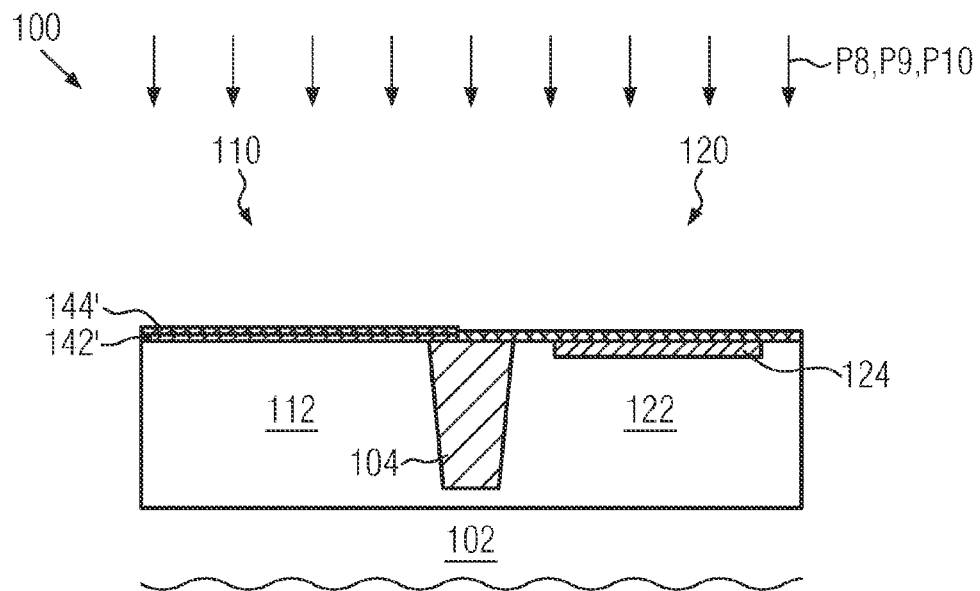

Furthermore, the process P7 may comprise a sub-process for equalizing the thickness of the layers 142' and 138 to form a layer 144' of substantially equal thickness over the semiconductor devices 110 and 120. In some illustrative embodiments herein, a wet TiN removal combined with a re-deposition of TiN may be performed. Therefore, as shown in FIG. 2d, a semiconductor circuit element 100 may be obtained, wherein the semiconductor devices 110 and 120 comprise a buried ferroelectric high-k material 124 in the active region 122 and a high-k material 142' disposed on or above the active region 112. Accordingly, a stack configuration for high-k materials in the semiconductor device 120 as is usually present in conventional semiconductor devices with ferroelectric high-k material, is not necessary.

Subsequently, a sequence of processes P8, P9 and P10 is performed as illustrated in FIG. 2d.

Figure 3A:
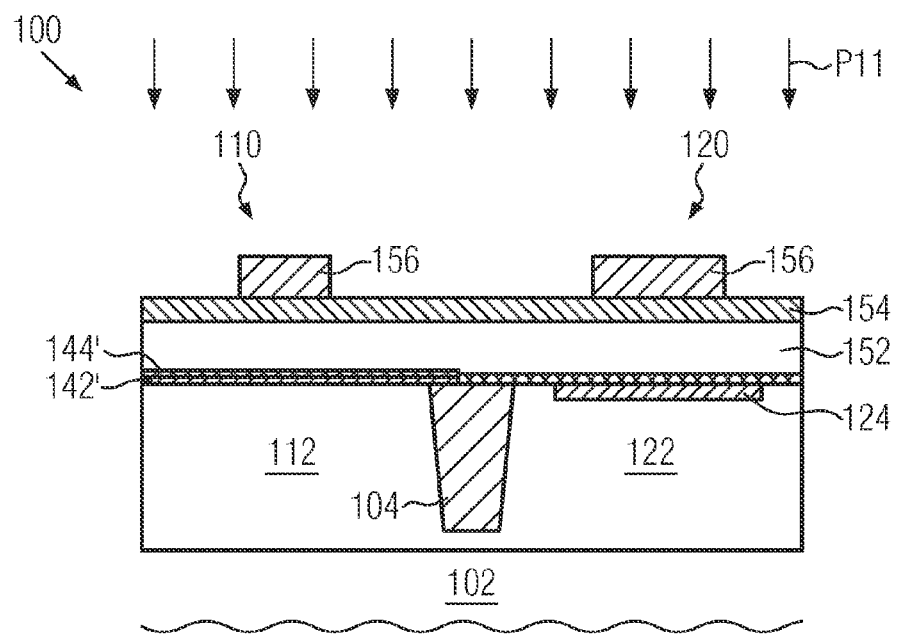
FIGS. 3a-3c schematically show, in accordance with some illustrative embodiments of the present disclosure, a process flow in which a first gate structure comprising the ferroelectric high-k material is formed and a second gate structure comprising the high-k material is formed.

FIG. 3a schematically illustrates the semiconductor circuit element 100 at a stage during fabrication, after the sequence of processes P8, P9 and P10 is completed and prior to the application of a process P11. At the illustrated stage during fabrication, the buried high-k material 124 represents a ferroelectric high-k material as described above.

In some illustrative embodiments, the process P8 may be performed for depositing a gate electrode material layer 152 over the semiconductor devices 110 and 120. In some explicit example, amorphous silicon or polysilicon may be deposited during the process P8.

In process P9, a cap layer 154 is formed on the gate electrode material layer 152 over the semiconductor devices 110 and 120. For example, a nitride material, such as silicon nitride, may be deposited.

In the process P10, a photoresist material is formed on the cap layer 154 and subsequently photolithographically patterned to form the patterned photoresist structure 156. The patterned photoresist structure 156 is patterned in accordance with gate structures to be formed over the active regions 112 and 122 of the semiconductor devices 110 and 120.

Subsequently, a process P11 is performed for patterning the cap layer 154, the gate electrode material layer 152 and the high-k material 142' over the active region 112 and to pattern the cap layer 154, the gate electrode material layer 152 and the cap layer 144' over the active region 122.

Figure 3B:
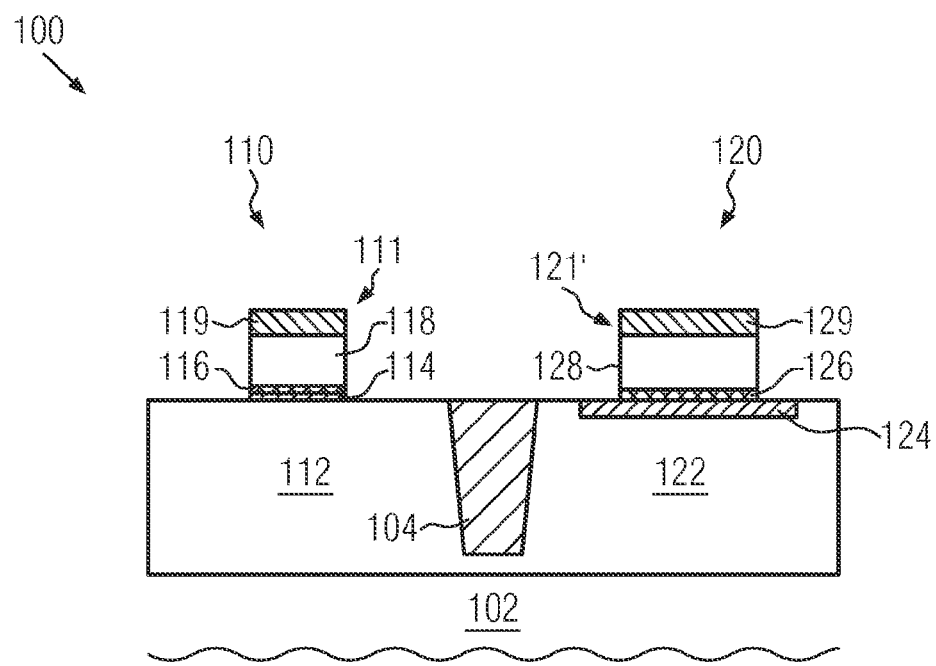

FIG. 3b schematically illustrates the semiconductor circuit element at a stage during fabrication, particularly after the process P11 is completed and the patterned photoresist structure 156 is removed. Herein, a gate structure 111 is formed on the active region 112 for the semiconductor device 110. The gate structure 111 comprises a gate cap 119, a gate electrode layer 118, a TiN layer 116 and a gate dielectric layer 114 comprising the high-k material.

After completing the process P11, the semiconductor device 120 substantially has a pre-gate structure 121' comprising a gate cap 129, a gate electrode layer 128, a TiN layer 126 and a partially patterned ferroelectric high-k material 124. Optionally, a thin nitride liner may be deposited over the gate structures 110 and 120 to protect the high-k materials. After forming a masking pattern covering the semiconductor device 110 and at least leaving the gate structure 121' and the exposed buried ferroelectric high-k material 124 exposed for further processing, e.g., masking structure 158 shown in FIG. 3c, an etching process is performed to remove the ferroelectric high-k material on the active region 122 in alignment with the gate structure 121', i.e., all ferroelectric high-k material unless that covered by the gate structure 121', such that the gate structure 121' is formed. In some illustrative embodiments, suitable dry etch processes may be performed on RIE tools with elevated process temperatures to etch the ferroelectric high-k material.

Figure 4:
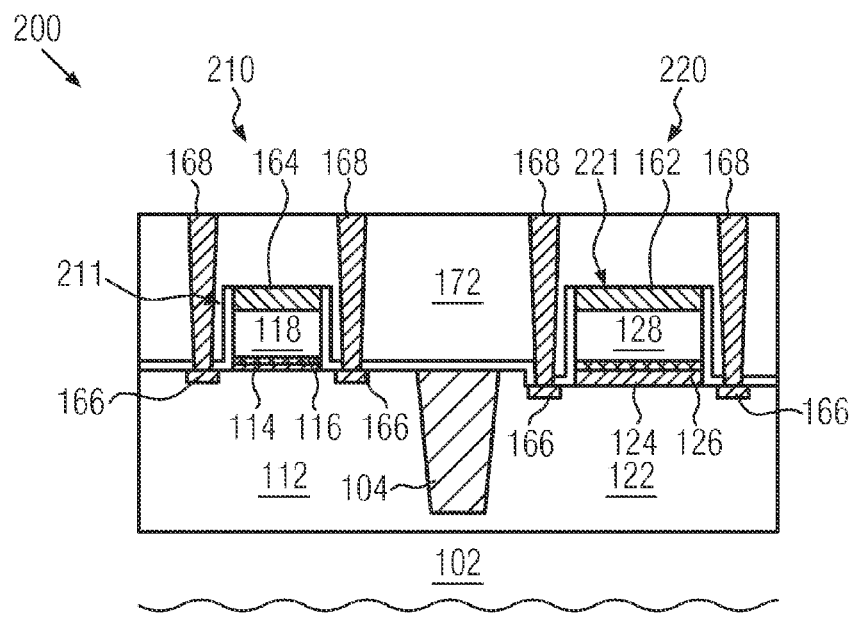
FIG. 4 schematically shows a semiconductor circuit element in accordance with some illustrative embodiments of the present disclosure, subsequently to processing as illustrated in FIGS. 1a-3c.

FIG. 4 schematically illustrates a semiconductor circuit element 200 comprising semiconductor devices 210 and 220, the semiconductor circuit element 200 being obtained from the semiconductor circuit element 100 after the masking pattern 158 is removed and source/drain regions 166 together with silicide regions and contact structures 168 contacting the source/drain regions 166 are formed. Furthermore, gate contact regions 162, 164 are formed on respective gate structures 221 and 211. The contact structure 168 may be formed in an ILD layer 172 as known in the art. In this way, an illustrative semiconductor circuit element 200 with semiconductor devices 210 and 220 may be formed in accordance with gate first techniques of some illustrative embodiments of the present disclosure.

Figure 3C:
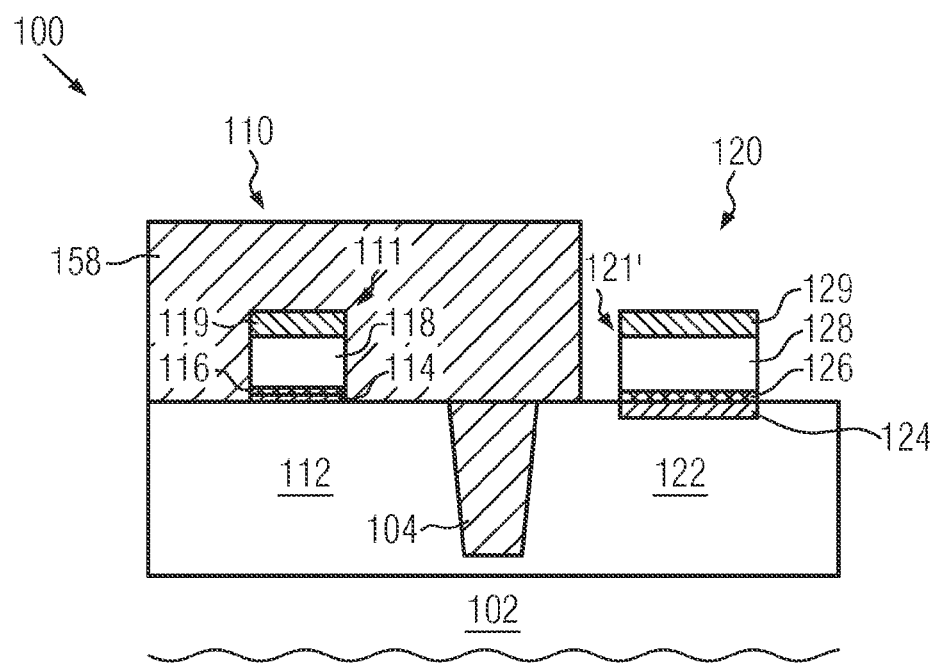
Figure 5:
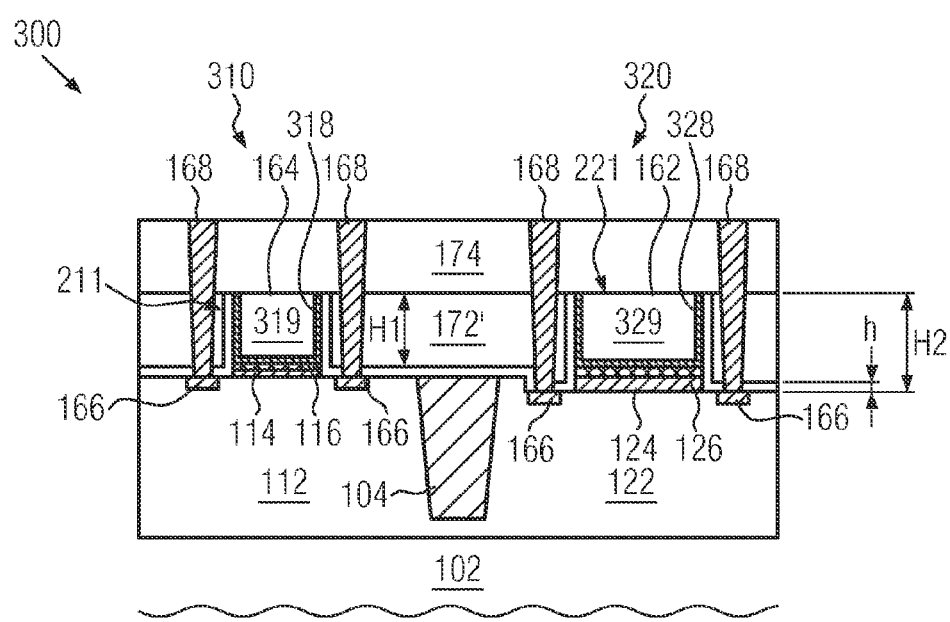
FIG. 5 schematically shows a semiconductor circuit element in accordance with other illustrative embodiments of the present disclosure, subsequent to processing as illustrated in FIGS. 1a-3c.

FIG. 5 schematically shows in a cross-sectional view a semiconductor circuit element 300 in accordance with gate last techniques of some illustrative embodiments of the present disclosure, in which subsequently to the processing illustrated in FIG. 3c, the gate electrode layers 118 and 128 are removed and, thus, a hybrid replacement gate approach is implemented. In an illustrative hybrid replacement gate approach, the gate electrode layers 118, 128 as illustrated in FIG. 3c represent dummy gate electrodes and are subsequently replaced by a work function-adjusting metal 318 and a gate electrode material 319 for the semiconductor device 310, while a work function-adjusting material layer 328 is formed in the gate structure 221 of the semiconductor device 320 together with gate electrode material 329. Herein, the gate electrode materials 319, 329 may comprise aluminum.

After a complete reading of the present application, a person skilled in the art will appreciate that the ferroelectric high-k material 124 is reliably protected by the cap layer 126 during the replacement of the gate electrode material layer 128 by the work function adjusting material 328 and the gate electrode material 329. Furthermore, a hybrid replacement gate approach is proposed in which parallel gate structures of the parallel semiconductor devices 310, 320 have different high-k materials 114 and 124. Particularly, the high-k material 114 may have a thickness which is smaller than a thickness of the buried ferroelectric high-k material 124. In some illustrative embodiments of the present disclosure, the thickness of the high-k material 114 may be in a range of about 1-4 nm and the thickness of the buried ferroelectric high-k material 124 may be in a range from about 4-15 nm. In some explicit examples herein, the ferroelectric high-k material 124 and the high-k material 114 may be different in that both only differ by the respective thickness values. In spite of the ferroelectric high-k material 124 being thicker than the high-k material 114, the gate structure 211 and the gate structure 221 extend along a normal direction of an upper surface of one of the active regions 112 and 122 up to a mutual height level as indicated in FIG. 5 by the height level H1 relative to an upper surface of the active region 112 and a height level H2 relative to an upper surface of the active region 122.

Furthermore, due to the initially buried high-k material 124, the gate structure 221 of the semiconductor device 320 is positioned lower in the semiconductor substrate 102 relative to an upper surface of the active region 112 as indicated by the height difference h in FIG. 5. A similar height difference is implemented in the semiconductor circuit element 200 as illustrated in FIG. 4, although the height difference is not explicitly depicted.

After a complete reading of the present application, a person skilled in the art will appreciate that in the methods according to the various illustrative embodiments of the present disclosure, gate structures in semiconductor devices of logic and ferroelectric areas of a semiconductor circuit element have a substantially equal height level and, therefore, result in a semiconductor circuit element which is compatible with gate first and replacement gate approaches. For example, the semiconductor devices 120, 220, 320 may represent a FeFET device, while the semiconductor devices 110, 210, 310 may represent a logic device.

It is noted that the ferroelectric high-k material layer of one semiconductor device is decoupled from the high-k material of another semiconductor device such that the gate dielectric layers of ferroelectric FETs and logic devices are decoupled.

After a complete reading of the present application, a person skilled in the art will appreciate that no thermal budget limitations arise in comparison to conventional process flows as the ferroelectric high-k material is formed at an early stage in the process flow. Particularly, nickel silicide degradation due to possibly high activation annealing temperatures for ferroelectric high-k material is avoided without implementing a complex process flow. Particularly, the process flow of replacement gate approaches is not affected by the early inclusion of the ferroelectric high-k material because the ferroelectric high-k material is patterned before dummy gate structures are replaced.

In the present disclosure it is generally proposed to form a ferroelectric high-k material layer very early in the front end of line process flow by burying a ferroelectric high-k material into the substrate prior to the formation of gate structures and gate oxides. A cap layer is further patterned to protect the ferroelectric high-k layer from any etch attack, such as RIE and HF etch processes in front end of line process flows prior to the gate formation. As a further advantage, the cap layer may later be used as an etch stop, allowing for a selective removal of high-k layers of other semiconductor devices, such as logic devices, without damaging the ferroelectric high-k material of ferroelectric semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor circuit element having a first semiconductor device and a second semiconductor device, the method comprising:
   forming said first semiconductor device in and above a first active region of a semiconductor substrate, said first semiconductor device comprising a first gate structure with a first gate dielectric layer; and
   forming said second semiconductor device in and above a second active region of said semiconductor substrate, said second semiconductor device comprising a second gate structure with a second gate dielectric layer;
   wherein said first gate dielectric layer is formed by forming a buried ferroelectric material in said first active region, and
   wherein said second gate dielectric layer is formed by forming a high-k material above said second active region, said high-k material being different from said ferroelectric material.

2. The method of claim 1, wherein forming said buried ferroelectric material comprises:
   forming a buried amorphous film of material in said first active region;
   forming a cap layer on said buried amorphous film of material;
   after forming said cap layer, forming said high-k material over said second active region; and
   crystallizing said buried amorphous film of material after said high-k material is formed over said second active region, said amorphous film of material exhibiting ferroelectric behavior in a crystalline phase.

3. The method of claim 2, wherein crystallizing said buried amorphous film comprises, prior to forming a gate electrode material over said first active region, performing an annealing process for crystallizing said buried amorphous film of material to become a buried ferroelectric material.

4. The method of claim 3, wherein forming said high-k material over said second active region comprises forming said high-k material on said cap layer and over said active region prior to performing said annealing process.

5. The method of claim 4, further comprising, prior to performing said annealing process, performing an etching process to remove a portion of said high-k material from above said cap layer while using said cap layer as an etch stop during said etching process.

6. The method of claim 1, wherein, after forming said high-k material on said second active region, the method further comprises forming a dummy gate electrode over said buried ferroelectric material and subsequently replacing said dummy gate electrode with a work function adjusting material and a gate electrode material.

7. The method of claim 6, wherein, prior to forming said high-k material over said second active region, the act of forming said buried ferroelectric material comprises:
   forming a buried amorphous film of material in said first active region, said amorphous film of material exhibiting ferroelectric behavior in a crystalline phase; and
   forming a cap layer on said buried amorphous film of material.

8. The method of claim 7, wherein said cap layer is used as an etch stop when replacing said dummy gate electrode.

9. The method of claim 1, wherein said ferroelectric material comprises one of ZrO and a hafnium-based material.

10. The method of claim 1, wherein forming said buried ferroelectric material in said first active region comprises:
forming a recess in said first active region;
forming an amorphous film of material in said recess, said amorphous film of material exhibiting ferroelectric behavior in a crystalline phase;
forming a cap layer on said amorphous film of material; and
crystallizing said amorphous film of material in said recess.

11. The method of claim 10, wherein crystallizing said amorphous film of material comprises performing an annealing process which is performed after said cap layer is formed.

12. The method of claim 11, wherein said second gate dielectric layer is formed prior to forming said first gate dielectric layer, said first and second gate dielectric layers being formed by sequentially patterning said high-k material and said buried ferroelectric material.

13. A method of forming a semiconductor circuit element, the method comprising:
forming a recess in a first active region of a semiconductor substrate;
forming a ferroelectric material in said recess;
forming a high-k material over a second active region of said semiconductor substrate adjacent to said first active region, said high-k material being different from said ferroelectric material;
forming a gate electrode material over said first and second active regions;
forming a first gate structure over said first active region by patterning said ferroelectric high-k material and said gate electrode material; and
forming a second gate structure over said second active region by patterning said high-k material and said gate electrode material.

14. The method of claim 13, wherein said high-k material is a second high-k material, and wherein forming said ferroelectric material in said recess comprises:
forming a first high-k material in said recess while masking said second active region with a mask layer;
performing a planarization process to remove said mask layer and planarize said first high-k material, wherein, after performing said planarization process, an upper surface of said second active region is substantially co-planar with an upper surface of said first active region and an upper surface of said first high-k material; and
forming said ferroelectric material from said planarized first high-k material.

15. The method of claim 14, wherein forming said ferroelectric material from said planarized first high-k material comprises at least partially crystallizing said first high-k material in a ferroelectric crystal configuration.

16. A method of forming a semiconductor circuit element, the method comprising:
forming a recess in a first active region of a semiconductor substrate;
forming an amorphous film of material in said recess, said amorphous film of material exhibiting ferroelectric behavior in a crystalline phase;
forming a first cap layer that covers said amorphous film of material;
forming a high-k material over a second active region of said semiconductor substrate after said cap layer is formed over said amorphous film of material, said high-k material being different from said amorphous film of material;
crystallizing said amorphous film of material for forming a ferroelectric material buried in said first active region;
forming a first gate dielectric layer over said first active region by patterning said ferroelectric material; and
forming a second gate dielectric layer over said second active region by patterning said high-k material.

17. The method of claim 16, wherein said second gate dielectric layer is formed before said forming of said first gate dielectric layer is completed.

18. The method of claim 16, further comprising forming a gate electrode material over said ferroelectric material before said ferroelectric material is patterned.

19. The method of claim 16, further comprising forming a second cap layer over said high-k material prior to crystallizing said amorphous film of material.

* * * * *